US010032746B2

(12) United States Patent
Chen

(10) Patent No.: US 10,032,746 B2
(45) Date of Patent: Jul. 24, 2018

(54) SEMICONDUCTOR DEVICE HAVING RECESSED EDGES AND METHOD OF MANUFACTURE

(71) Applicant: Taiwan Semiconductor Manufacturing Company, Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/258,933

(22) Filed: Sep. 7, 2016

(65) Prior Publication Data

US 2016/0379956 A1 Dec. 29, 2016

Related U.S. Application Data

(62) Division of application No. 14/478,646, filed on Sep. 5, 2014, now Pat. No. 9,443,780.

(51) Int. Cl.
*H01L 23/538* (2006.01)
*H01L 21/768* (2006.01)
(Continued)

(52) U.S. Cl.
CPC ............. *H01L 24/97* (2013.01); *H01L 21/31* (2013.01); *H01L 21/56* (2013.01); *H01L 21/561* (2013.01); *H01L 21/565* (2013.01); *H01L 21/76885* (2013.01); *H01L 21/76895* (2013.01); *H01L 21/78* (2013.01); *H01L 23/31* (2013.01); *H01L 23/3107* (2013.01); *H01L 23/3114* (2013.01);
(Continued)

(58) Field of Classification Search
CPC ............. H01L 23/5386; H01L 23/5389; H01L 21/76885; H01L 2224/92244; H01L 2225/06548
See application file for complete search history.

(56) References Cited

U.S. PATENT DOCUMENTS 5,336,931 A * 8/1994 Juskey .................... H01L 23/24
174/522
5,697,149 A * 12/1997 Munch ............. G06K 19/07745
29/841
(Continued)

FOREIGN PATENT DOCUMENTS

CN         102169841 A    8/2011
KR         20140104883    8/2014
(Continued)

*Primary Examiner* — David Zarneke
(74) *Attorney, Agent, or Firm* — Slater Matsil, LLP

(57) ABSTRACT

A device and method of manufacture is provided that utilize recessed regions along a package edge. For example, in an integrated fan-out package, the dielectric layers, e.g., the polymer layers, of the redistribution layers are removed along the scribe line such that after singulation the dielectric layers are recessed back from the edges of the die. The corner regions may be recessed further. The recessed regions may be triangular, rounded, or other shape. In some embodiments one or more of the corner regions may be recessed further relative to the remaining corner regions. The redistribution layers may be recessed along one or both of the front side redistribution layers and the backside redistribution layers.

20 Claims, 16 Drawing Sheets

(51) Int. Cl.
*H01L 23/00* (2006.01)
*H01L 23/31* (2006.01)
*H01L 21/31* (2006.01)
*H01L 21/56* (2006.01)
*H01L 21/78* (2006.01)
*H01L 25/065* (2006.01)
*H01L 23/528* (2006.01)
*H01L 21/786* (2006.01)
*H01L 21/84* (2006.01)
*H01L 25/10* (2006.01)

(52) U.S. Cl.
CPC .......... *H01L 23/5389* (2013.01); *H01L 24/19* (2013.01); *H01L 24/24* (2013.01); *H01L 24/32* (2013.01); *H01L 24/92* (2013.01); *H01L 25/0657* (2013.01); *H01L 21/786* (2013.01); *H01L 21/84* (2013.01); *H01L 23/3121* (2013.01); *H01L 23/3128* (2013.01); *H01L 23/3171* (2013.01); *H01L 23/528* (2013.01); *H01L 23/5386* (2013.01); *H01L 24/45* (2013.01); *H01L 24/48* (2013.01); *H01L 24/73* (2013.01); *H01L 24/83* (2013.01); *H01L 25/105* (2013.01); *H01L 2224/32145* (2013.01); *H01L 2224/32225* (2013.01); *H01L 2224/45147* (2013.01); *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/92244* (2013.01); *H01L 2224/97* (2013.01); *H01L 2225/0651* (2013.01); *H01L 2225/0652* (2013.01); *H01L 2225/06548* (2013.01); *H01L 2225/06572* (2013.01); *H01L 2225/1035* (2013.01); *H01L 2225/1041* (2013.01); *H01L 2225/1058* (2013.01); *H01L 2924/00014* (2013.01); *H01L 2924/15311* (2013.01); *H01L 2924/181* (2013.01)

(56) References Cited

U.S. PATENT DOCUMENTS

| | | | |
|---|---|---|---|
| 6,580,620 B1* | 6/2003 | Kim | H01L 21/565 257/787 |
| 7,384,805 B2* | 6/2008 | Kinsman | H01L 21/565 257/E21.504 |
| 8,143,110 B2 | 3/2012 | Karpur et al. | |
| 8,254,134 B2 | 8/2012 | Hiew et al. | |
| 9,099,363 B1* | 8/2015 | Wong | H01L 23/13 |
| 2002/0149104 A1* | 10/2002 | Huang | H01L 21/565 257/730 |
| 2011/0147912 A1* | 6/2011 | Karpur | H01L 21/563 257/687 |
| 2011/0176285 A1 | 7/2011 | Park et al. | |
| 2012/0264257 A1 | 10/2012 | Lee et al. | |
| 2014/0124961 A1 | 5/2014 | Wu et al. | |
| 2014/0159248 A1 | 6/2014 | Mohammed et al. | |
| 2014/0231984 A1 | 8/2014 | Chen | |
| 2015/0179616 A1* | 6/2015 | Lin | H01L 25/50 257/773 |

FOREIGN PATENT DOCUMENTS

TW 568351 12/2003
TW 201411740 A 3/2014

* cited by examiner

SEMICONDUCTOR DEVICE HAVING RECESSED EDGES AND METHOD OF MANUFACTURE

This application is a divisional application of, and claims priority to, U.S. patent application Ser. No. 14/478,646, entitled "Semiconductor Device having Recessed Edges and Method of Manufacture," filed on Sep. 5, 2014, which application is incorporated herein in its entirety by reference.

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components, such as integrated circuit dies, also require smaller packages that utilize less area than packages of the past, in some applications.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect (PPI) that is used to fan-out wiring for contact pads of the package, so that electrical contacts can be made on a larger pitch than contact pads of the integrated circuit. Such resulting package structures provide for high functional density with relatively low cost and high performance packages.

These packages may be combined in a package-on-package process, wherein a top package is bonded to a bottom package. The top package and the bottom package may also have device dies packaged therein. By adopting the package-on-package (PoP) process, the integration level of the packages is increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
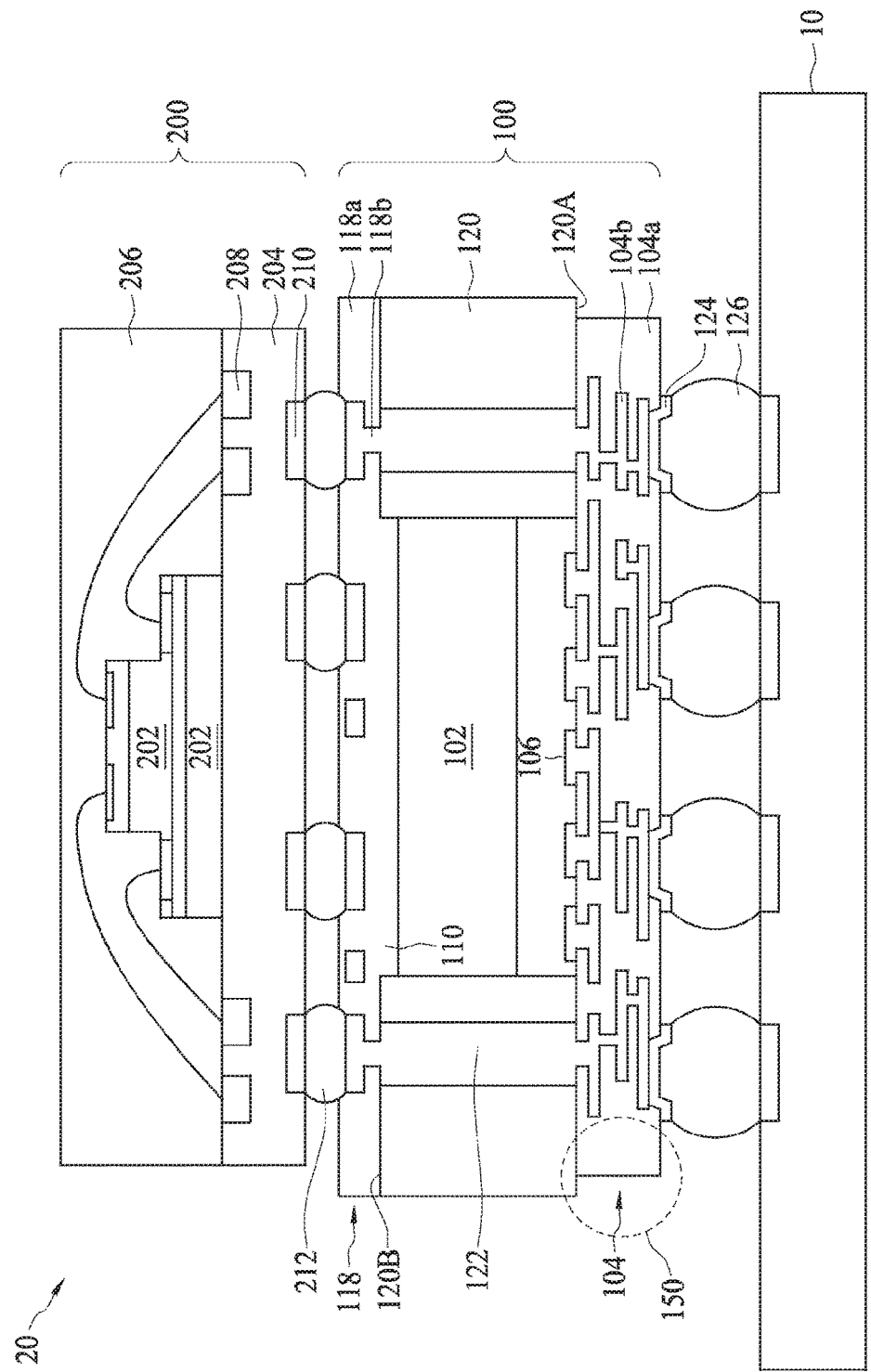
FIG. 1 is a cross-sectional view of a package-on-package illustrating features of an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to packaging devices and methods of manufacture thereof for semiconductor devices. Embodiments will be described in the context of forming a package, particularly a fan-out package. Other embodiments may utilize features such as those described herein in other embodiments.

As will be discussed in greater detail below, devices and methods of manufacture will be disclosed to reduce or eliminate delamination during, for example, dicing operations. In some situations, dicing may cause increased stresses between, for example, the molding compound and overlying redistribution layers, such as the polymer or polybenzoxazole (PBO) materials of the redistribution layers. Embodiments are described below that recesses or removes the redistribution layers from the scribe line area such that a dicing operation is not needed on the redistribution layers. In embodiments such as these, the redistribution layers are not formed in the scribe line area and the subsequent dicing operation is performed on the molding compound. Because the dicing operation does not extend through the redistribution layers, delamination may be reduced or prevented between the molding compound and the redistribution layers. In addition to removing or omitting the redistribution layers from the scribe line areas, additional portions of the redistribution layers is removed or omitted from the corner regions to form, for example, a rounded or tapered corner of the redistribution layers.

FIG. 1 illustrates a cross-sectional view of package-on-package (PoP) 20 in accordance with some embodiments. Package 20 includes a bottom package 100 and a top package 200 over and bonded to the bottom package 100. In some embodiments, the bottom package 100 includes device die 102 (one being shown), with the front sides of device die 102 facing down and bonded to front side redistribution lines (RDLs), collectively referred to by reference numeral 104. In alternative embodiments, the bottom package 100 may include any number of device dies, such as one device die, two device die, or more than two device die. Device die 102 may include a semiconductor substrate and integrated circuit devices (such as active devices, which include transistors, for example) at the front surface (the surface facing down) of semiconductor substrate. Device die 102 may include a logic die such as a central processing unit (CPU) die, a graphic processing unit (GPU) die, a mobile application die, or the like.

The front side redistribution lines 104 include one or more dielectric layers 104a having conductive interconnect structures 104b (e.g., metal lines and/or vias) formed therein. The dielectric layers 104a may be formed of, for example, organic materials such as polymers, which may further include PBO, benzocyclobutene (BCB), polyimide, or the like. In alternative embodiments, the dielectric layers 104a are formed of inorganic material such as silicon oxide, silicon nitride, silicon oxynitride, or the like. The conductive interconnect structures 104b may be formed of, for example, copper, aluminum, nickel, titanium, other conductive materials, alloys thereof, multi-layers thereof, and the like.

The device die 102 is molded in molding material 120, which surrounds each of device die 102. Molding material 120 may be a molding compound, a molding underfill, a resin, or the like. Surface 120A of the molding material 120 may be level with the bottom surfaces of the device die 102, and surface 120B of molding material 120 may be level with or higher than a back surface of the semiconductor substrate of the device die 102. In some embodiments, the back surface of the semiconductor substrate of the device die 102 is in contact with a die-attach film 110, which is a dielectric film adhering device die 102 to overlying backside redistribution lines 118. The device die 102 further includes contacts 106 (which may include conductive (e.g., copper) pillars, pads, or the like for example) electrically coupled to the front side redistribution lines 104.

Through vias 122 are formed in, and may substantially penetrate through, the molding material 120. In some embodiments, the through vias 122 have first surfaces (the top surfaces in FIG. 1) level with the surface 120B of the molding material 120, and second surfaces (the bottom surfaces in FIG. 1) substantially level with the surface 120A of the molding material 120. Through vias 122 electrically couple the front side redistribution lines 104 to the back side redistribution lines 118, which may include one or more dielectric layers 118a and one or more interconnect structures 118b, similar to the first side redistribution lines 104.

Under-bump metallizations (UBMs) 124, which are formed of a non-solder metallic material(s), are formed close to the bottom surface of package 100. The UBMs 124 may include copper, aluminum, titanium, nickel, palladium, gold, or multi-layers thereof. In some embodiments, the bottom surfaces of UBMs 124 extend below the bottom surface of the bottom dielectric layer 104a, as shown in FIG. 1. First connectors 126, such as solder balls/bumps, may be attached to the bottom surfaces of UBMs 124 for attaching to a substrate 10, such as a printed circuit board (PCB), a packaging substrate, another die or package, or the like.

The top package 200 may also include device dies, such as device dies 202, which may be memory dies, logic dies, or the like. In the embodiment illustrated in FIG. 1, the device dies 202 are mounted on a package substrate 204 and are molded in molding material 206. In some embodiments, the device dies 202 are mounted to the package substrate 204 and electrically coupled to contacts 208 using wire bonding techniques. The contacts 208 are electrically coupled to the top package external contacts 210 using, for example, one or more redistribution lines and vias (not individually shown). The top package 200 is electrically coupled to the bottom package 100 by, for example, second connectors 212, such as solder balls/bumps.

Referring still to FIG. 1, there is shown reference areas 150 as illustrated by the dotted circle. As discussed above, singulating, such as sawing, creates stress along the boundary between the various layers. For example, in the embodiment of a fan-out package as illustrated in FIG. 1, stresses caused during sawing may cause delamination issues between the molding compound and dielectric (e.g., the PBO layers) of the front side redistribution layers 104. Embodiments such as those included herein remove the dielectric layers of the redistribution layers such that the dielectric layers are not overlying the molding compound along the scribe line areas. Additional material of the dielectric layers are removed along the corner regions of the die, such as that illustrated in FIG. 2.

Figure 2:
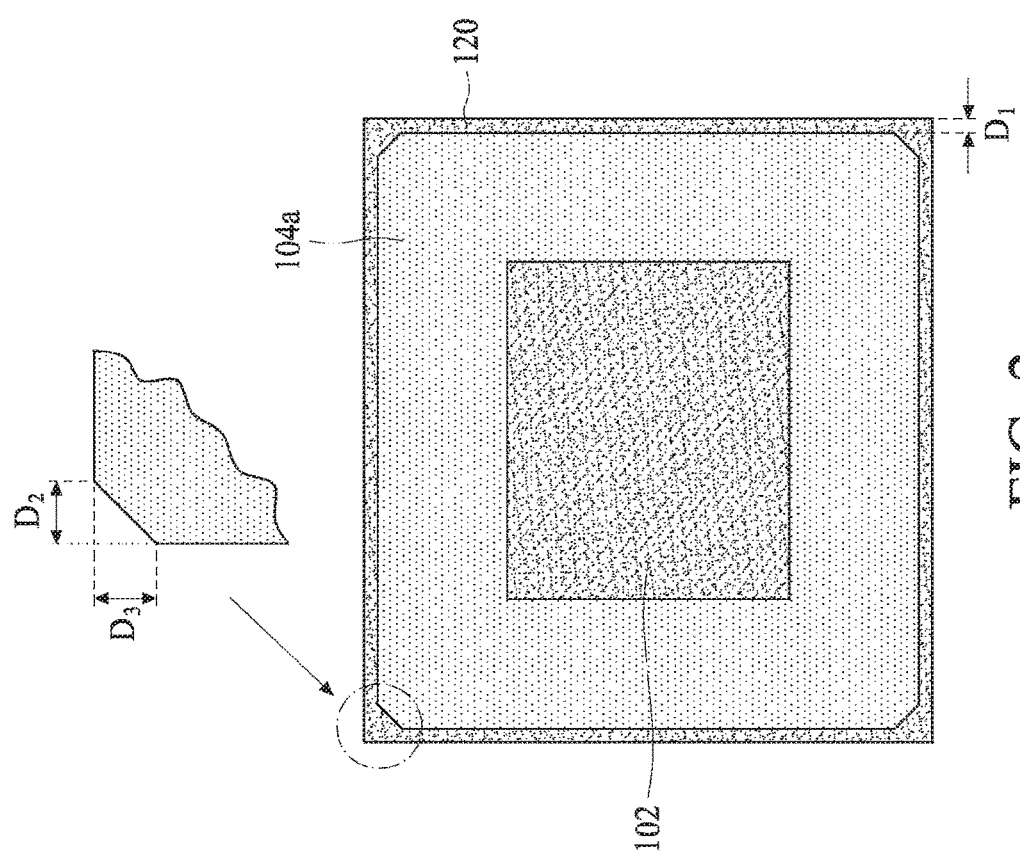
FIG. 2 is a plan view of a bottom package illustrated in FIG. 1 in accordance with an embodiment.

FIG. 2 illustrates a plan view from the bottom of the bottom package 100 of FIG. 1 in accordance with some embodiments. As shown in FIG. 2, the front side redistribution layers 104 are recessed away from an edge of the underlying molding material 120 and the edge of the bottom package 100 by a distance $D_1$. In some embodiments, the distance $D_1$ is greater than about 30 μm, such as about 30 μm to about 50 μm. Additionally, the front side redistribution layers 104 may be recessed away from corners of the underlying molding material 120, thereby forming tapered corners. For example, in the embodiment illustrated in FIG. 2, the front side redistribution layers 104 are recessed away from a corner of the molding compound by a distance $D_2$ and $D_3$ to provide tapered corners. In some embodiments, the distance $D_2$ and $D_3$ are the same. In some embodiments, $D_2$ and $D_3$ have a length about 30 μm to about 100 μm. Dimensions such as these provide a sufficient amount of recess to reduce or prevent delamination issues.

Figure 3A:
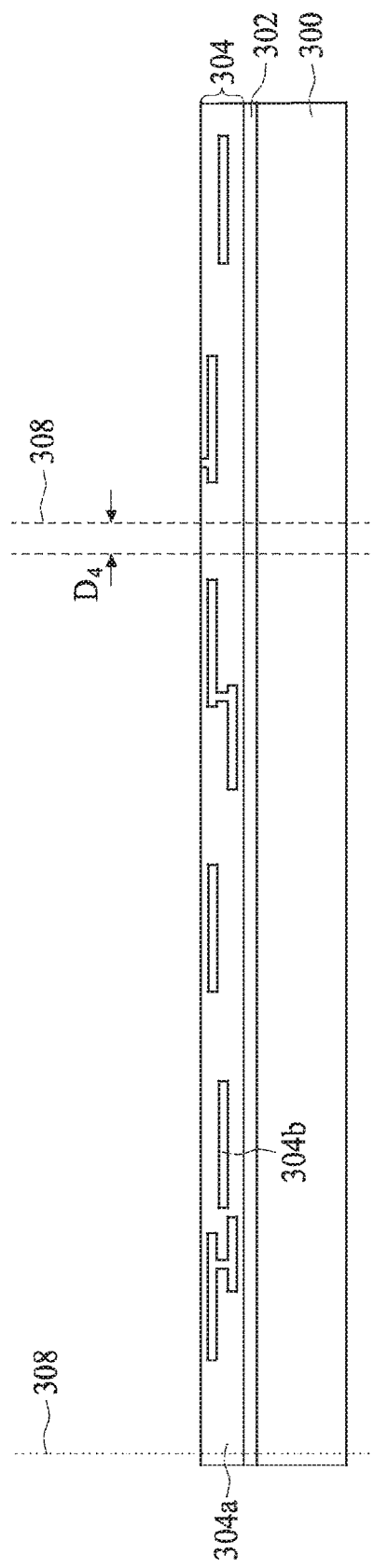
FIGS. 3A-3I illustrate various intermediate process steps in manufacturing a package in accordance with some embodiments.

Referring now to FIGS. 3A through 3I, there are illustrated various cross-sectional views of intermediate steps of manufacturing a semiconductor device such as that discussed above with reference to FIGS. 1 and 2 in accordance with some embodiments. Referring first to FIG. 3A, there is shown a carrier substrate 300 having an adhesive layer 302 and one or more optional backside redistribution layers 304 formed thereon, wherein the dotted lines 308 represent the scribe line areas. As will be discussed in greater detail below, a die will be placed on the carrier substrate 300 having the contact pads face up. The backside redistribution layers 304 provide for electrical connections on both sides of the package, allowing for stacked package, e.g., PoP configurations, such as that illustrated in FIG. 1. Alternatively, the backside redistribution layers 304 may be omitted if a die, package, or other substrate will not be stacked upon the current package.

The scribe lines 308 represent the region in which the structure will be singulated into separate packages. As will be discussed in greater detail below, certain features, such as front side and/or backside redistribution layers will be omitted in the scribe lines 308. In some embodiments, the scribe lines 308 have a width $D_4$ of about 100 μm to about 500 μm, such as about 200 μm. In some embodiments, a saw having a cut width of about 40 μm is used.

Generally, the carrier substrate 300 provides temporary mechanical and structural support during subsequent processing steps. Additionally, as illustrated in FIG. 3A, the carrier substrate 300 provides a surface on which to form the backside redistribution layers 304. The carrier substrate 300 may comprise, for example, glass, silicon oxide, aluminum oxide, and the like.

The backside redistribution layers 304 include one or more layers of dielectric materials with conductive features (e.g., conductive lines and vias) formed therein. The one or more layers of dielectric materials are represented collectively as backside dielectric layers 304a, and the conductive features are collectively represented as backside conductive features 304b.

The backside dielectric layers 304a may be formed of any suitable material (e.g., polyimide (PI), PBO, BCB, epoxy, silicone, acrylates, nano-filled pheno resin, siloxane, a fluorinated polymer, polynorbornene, an oxide, a nitride, and the like) using any suitable method (e.g., a spin-on coating technique, sputtering, and the like). The formation of the backside conductive features 304b may include patterning the backside dielectric layers 304a (e.g., using photolithography and/or etching processes) and forming backside conductive features 304b in the patterned backside dielectric layers 304a (e.g., by depositing a seed layer, using a mask layer to define the shape of the conductive features, and using an electroless/electrochemical plating process).

Figure 3B:
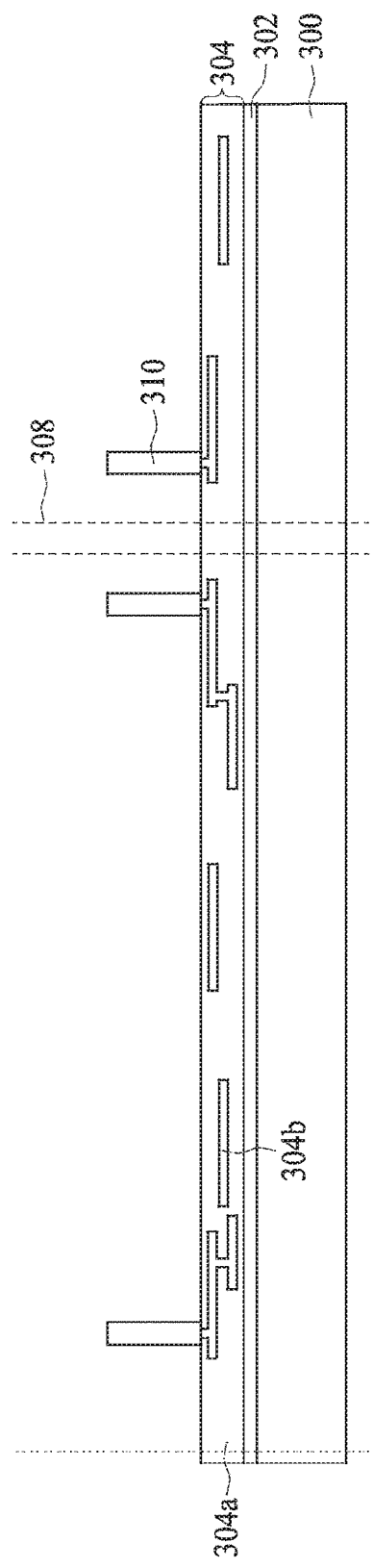

FIG. 3B illustrates formation of optional through vias 310 in accordance with some embodiments. The optional through vias 310 provide an electrical connection from one side of the package to another side of the package. For example, as will be explained in greater detail below, a die will be mounted to the backside redistribution layers 304 and a molding compound will be formed around the through vias and the die. Subsequently, another device, such as another die, package, substrate, or the like, may be attached to the die and the molding compound. The through vias 310 provide an electrical connection between the another device and the backside redistribution layers 304 without having to pass electrical signals through the die mounted to the backside redistribution layers 304.

The through vias 310 may be formed, for example, by forming a conductive seed layer (not shown) over the backside redistribution layers 304. A mask (not shown), such as a patterned photoresist layer, may be deposited and patterned to define the shape of the through vias 310, wherein openings in the mask expose the seed layer. The openings may be filled with a conductive material using, for example, an electroless plating process or an electrochemical plating process. The plating process may uni-directionally fill openings (e.g., from seed layer upwards) in the patterned photoresist. Uni-directional filling may allow for more uniform filling of such openings, particularly for high aspect ratio through vias. Alternatively, a seed layer may be formed on sidewalls of openings in the patterned photoresist, and such openings may be filled multi-directionally. Subsequently, the photoresist may be removed in an ashing and/or wet strip process, leaving the through vias 310 over and electrically connected to backside redistribution layers 304 as illustrated in FIG. 3B. The through vias 310 can also be realized with metal wire studs placed by a wire bonding process, such as a copper wire bonding process. The use of a wire bonding process may eliminate the need for depositing a seed layer, depositing and patterning a photoresist, and plating to form the through vias 310.

Figure 3C:
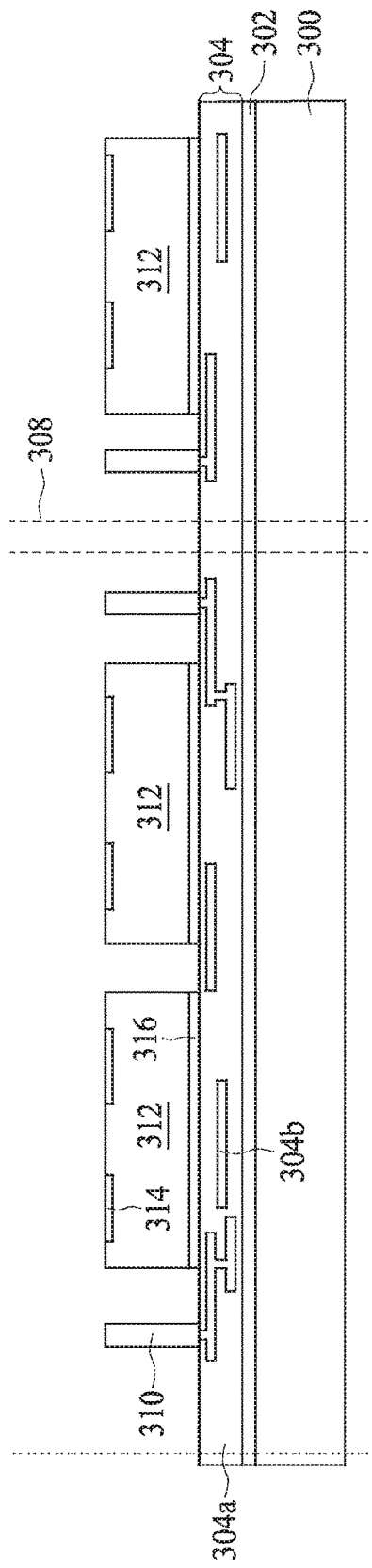

Referring now to FIG. 3C, there is shown die 312 attached to the backside redistribution layers 304 in accordance with some embodiments. The die 312 may include a substrate having any type of circuitry suitable for a particular application formed thereon. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The die 312 may include one or more dielectric layers overlying the electrical devices, and metal layers may be formed between dielectric layers to route electrical signals between the electrical devices. Electrical devices may also be formed in one or more dielectric layers. The die 312 includes external contacts, such as contacts 314, in the uppermost dielectric layer to provide external electrical connections to the electrical circuitry. In an embodiment, the contacts 314 are aluminum pads or aluminum-copper pads, although other metallic materials may be used. The contacts 314 may be pads, pillars, solder balls, wire studs, or other conductive electrical connection to the electrical circuitry of the die 312.

The die 312 may be attached to the backside redistribution layer 304 using, for example, an adhesive layer 316 (e.g., a die attach film (DAF)) disposed on a back surface. In an embodiment, the adhesive layer 316 may be any suitable adhesive, such as an ultraviolet (UV) glue, which loses its adhesive property when exposed to UV lights.

Figure 3D:
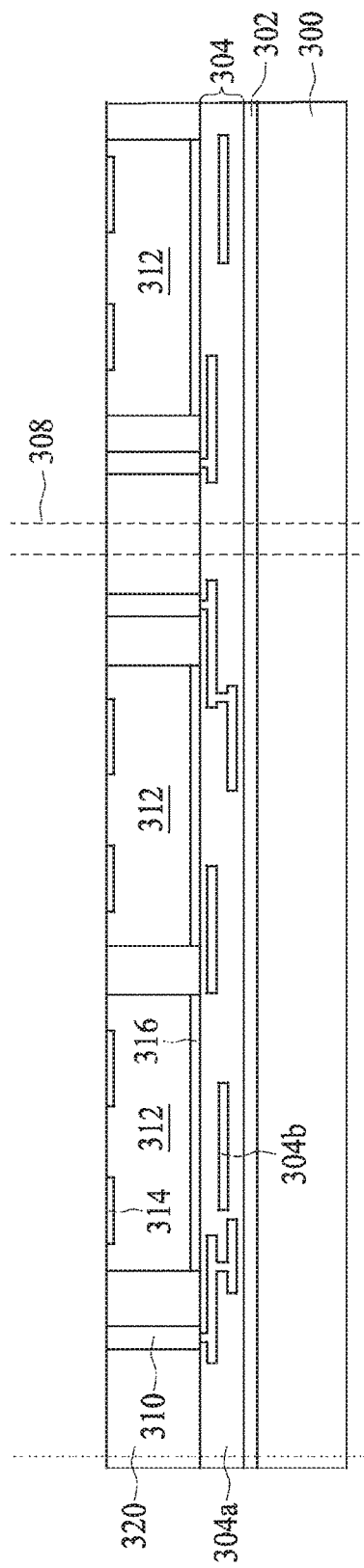

FIG. 3D illustrates a molding process and molding grind back in accordance with some embodiments. In some embodiments, the molding process is a wafer-level molding process. For example, molding compound 320 is dispensed to fill gaps between the die 312 and the through vias 310. The molding compound 320 may include any suitable material such as an epoxy resin, a molding underfill, and the like. Suitable methods for forming the molding compound 320 may include compressive molding, transfer molding, liquid encapsulant molding, and the like. For example, the molding compound 320 may be dispensed between the die 312 and the through vias 310 in liquid form. Subsequently, a curing process is performed to solidify the molding compound 320. The filling of the molding compound 320 may overflow the die 312 and the through vias 310 so that the molding compound 320 covers top surfaces of the die 312 and the through vias 310. A mechanical grinding, chemical mechanical polish (CMP), or other etch back technique may be employed to remove excess portions of the molding compound 320 and expose the contacts 314 of the die 312. After planarization, top surfaces of the molding compound 320, the die 312, and the through vias 310 may be substantially level.

Figure 3E:
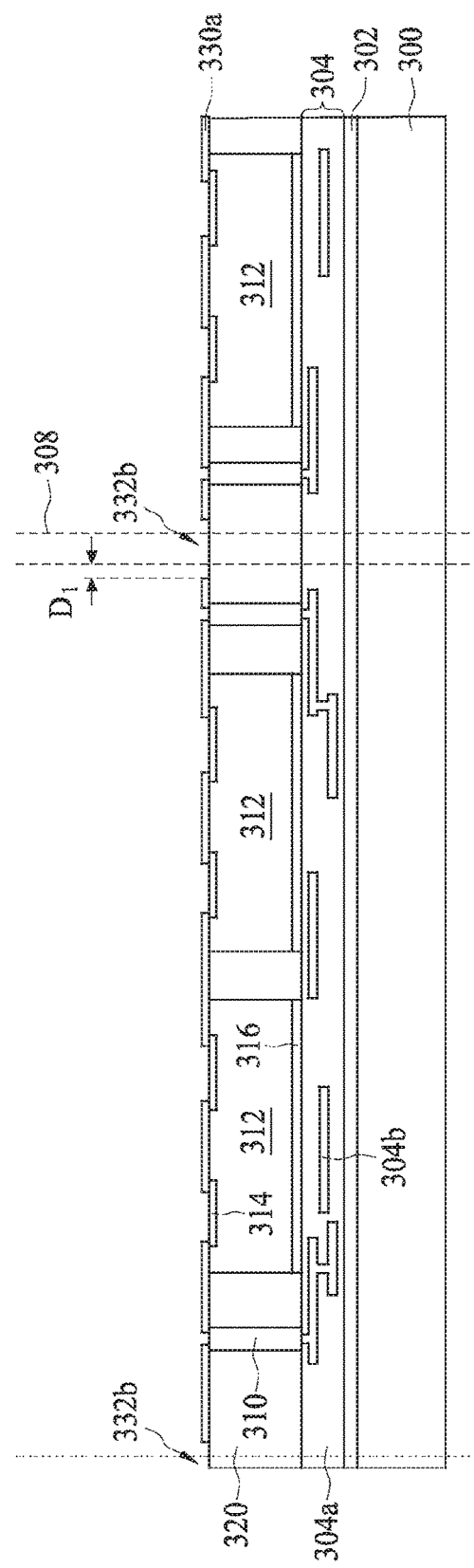

Referring next to FIG. 3E, there is shown a first front side dielectric layer 330a in accordance with some embodiments. The first front side dielectric layer 330a may be formed of any suitable material (e.g., PI, PBO, BCB, epoxy, silicone, acrylates, nano-filled pheno resin, siloxane, a fluorinated polymer, polynorbornene, an oxide, a nitride, and the like) using any suitable method (e.g., a spin-on coating technique, sputtering, and the like).

As illustrated in FIG. 3E, the first front side dielectric layer 330a is patterned to define openings 332a to expose the contacts 314 of the die 312 and the through vias 310. The first front side dielectric layer 330a is further patterned define openings 332b along the scribe lines 308. Although not shown explicitly in FIG. 3E, the openings 332b also remove material of the first front side dielectric layer 330a along the corner regions, such as that illustrated in FIGS. 1, 2, and/or 4A-6B. As discussed above, removing the dielectric layers of the front side redistribution layers from the scribe line areas and/or the corner regions reduces or eliminates delamination issues along the edge of the die due to the dicing operation. In embodiments in which a photosensitive material is used to form the first front side dielectric layer 330a, the patterning may be performed using a photolithography process.

Figure 3F:
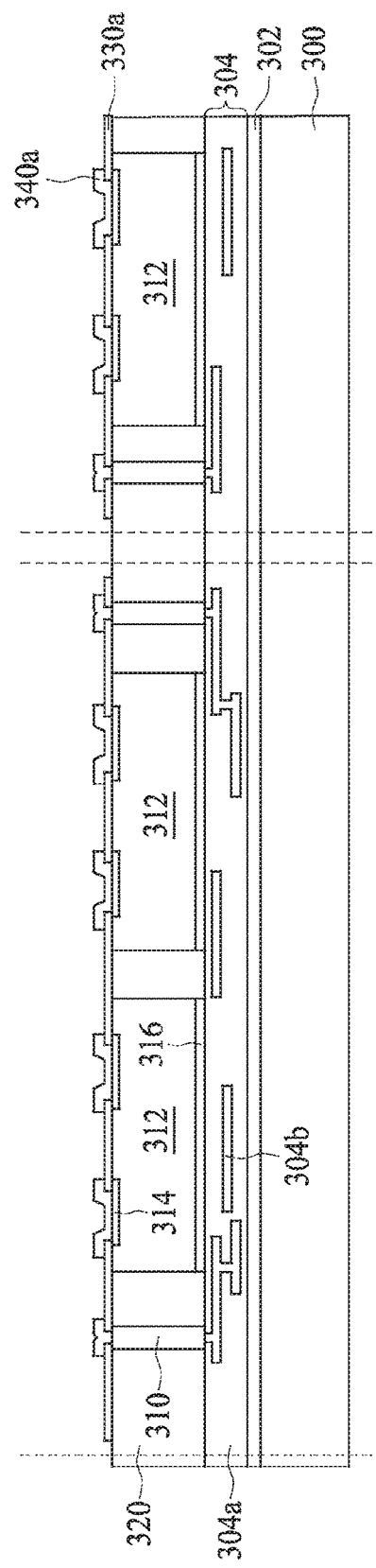

FIG. 3F illustrates formation of a first front side metallization layer 340a in accordance with some embodiments. The first front side dielectric layer 330a and the first front side metallization layer 340a collectively form a first redistribution layer. The first front side metallization layer 340a may be formed by forming a conductive seed layer (not shown) over the front side dielectric layer 330a. A mask, such as a patterned photoresist layer, may be deposited and patterned to define the shape of the first front side metallization layer 340a, wherein openings in the mask expose the seed layer. The openings may be filled with a conductive material using, for example, an electroless plating process or an electrochemical plating process. Subsequently, the photoresist may be removed in an ashing and/or wet strip process, leaving the first front side metallization layer 340a as illustrated in FIG. 3F.

Figure 3G:
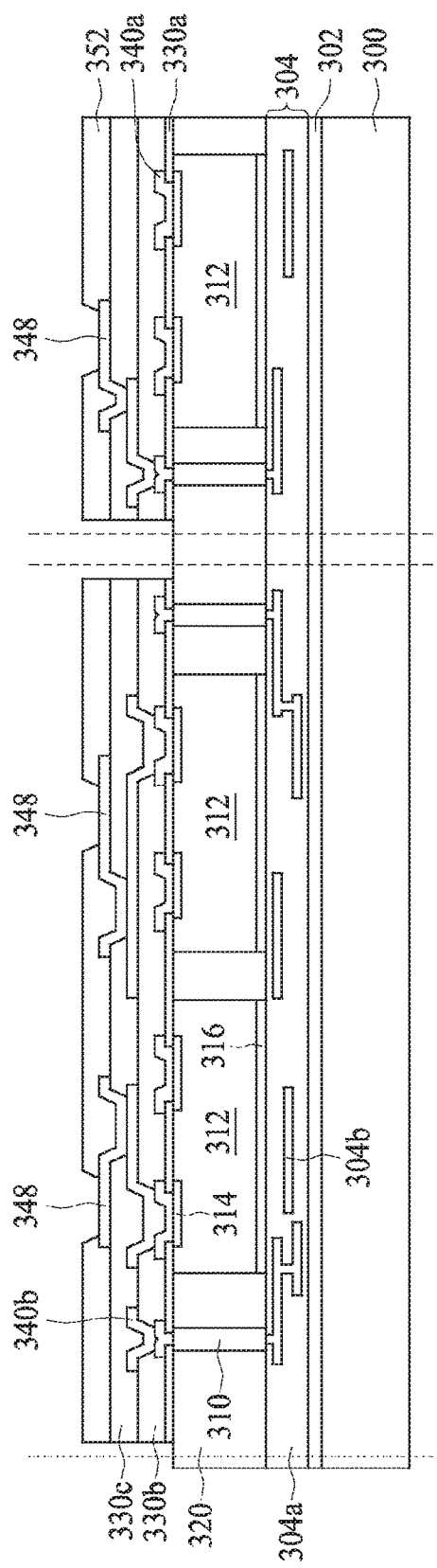

FIG. 3G illustrates forming one or more additional front side dielectric layers and front side metallization layers in accordance with some embodiments. FIG. 3G illustrates one additional dielectric layer and metallization layer (e.g., second front side dielectric layers 330b and second front side metallization layers 340b for illustrative purposes. The additional front side dielectric layers and the front side metallization layers may be formed using similar processes and materials as described above with reference to the first front side dielectric layer 330a and the first front side metallization layer 340a, respectively. As illustrated in FIG. 3G, the additional front side dielectric layers are patterned such that the dielectric material is also removed along the scribe lines and the corner regions as described above. In other embodiments, no, fewer, or more additional dielectric layers and redistribution layers may be present.

FIG. 3G further illustrates one or more protective layers 352 formed over front side redistribution layers in accordance with some embodiments. Protective layers 352 may be formed of a polymer such as an epoxy, polyimide, BCB, PBO, and the like. The formation methods may include spin coating, for example. The protective layers 352 are patterned to form an opening, through which contact pads 348 formed within an uppermost front side redistribution layer are exposed. The patterning of protective layers 352 may include photolithography techniques. A curing step may be performed to cure the protective layers 352.

Figure 3H:
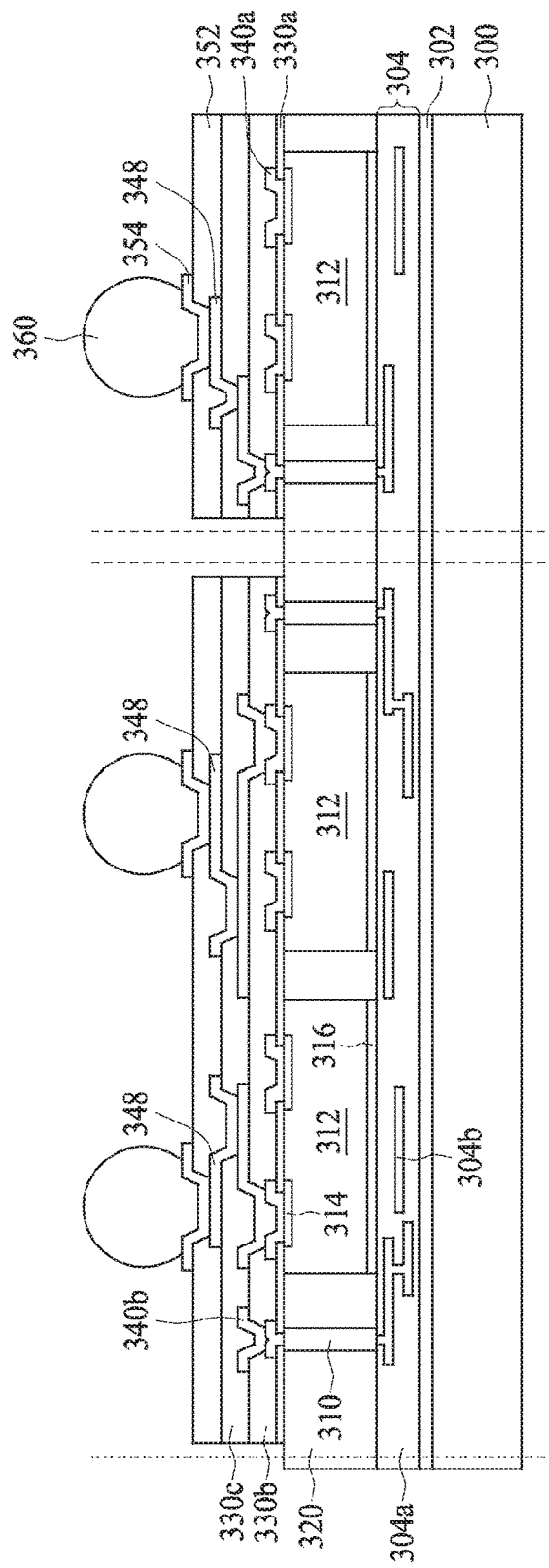

FIG. 3H illustrates an under bump metallization (UBM) 354 formed and patterned over the one or more protective layers 352, extending through the one or more protective layers 352 to form an electrical connection with the contact pads 348. The under bump metallization 354 provides an electrical connection upon which an electrical connector, e.g., a solder ball/bump, may be placed. In an embodiment, the under bump metallization 354 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, under bump metallization 354 is formed using sputtering. In other embodiments, electro plating may be used.

FIG. 3H also illustrates a connector 360 formed over the under bump metallization 354 in accordance with some embodiments. In an embodiment, the connector 360 comprises a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 360 may be one among an array of the connectors formed as a grid, such as a ball grid array (BGA). The connector 360 comprises a conductive ball having a shape of a partial sphere in some embodiments. Alternatively, the connector 360 may comprise other shapes. The connector 360 may also comprise non-spherical conductive connectors, for example.

The connectors 360 are attached in some embodiments using a solder ball drop process. During the mounting process of the connectors 360, or after the conductive material mounting process, the eutectic material may be re-flowed.

Figure 3I:
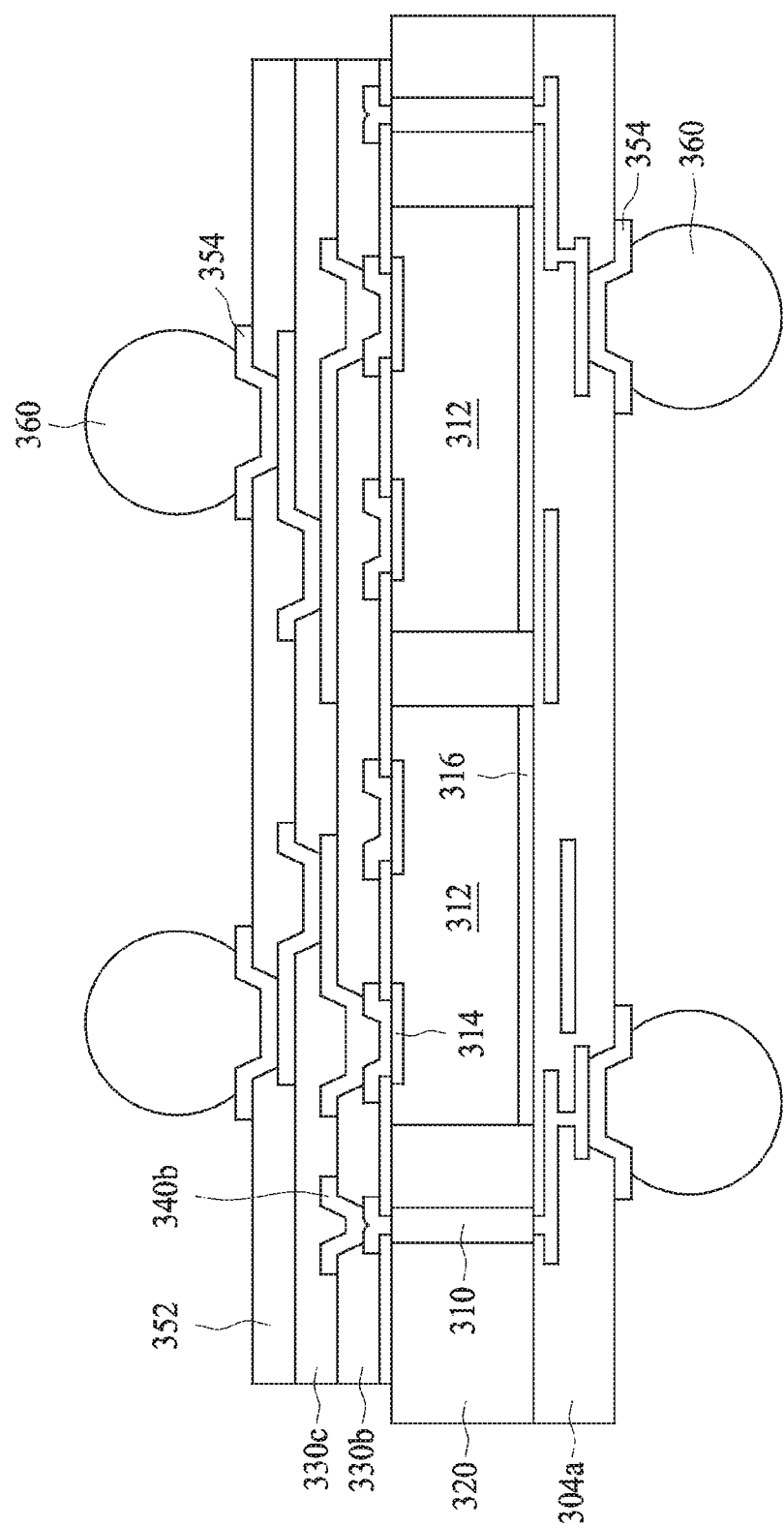

FIG. 3I illustrates the resulting structure after removing the carrier substrate 300 and the adhesive layer 302 (see FIG. 3H) in accordance with an embodiment. FIG. 3I also illustrates the structure after forming UBMs 354 and connectors 360 along on the backside redistribution layers 304 for connection to another substrate, such as another package, a printed circuit board, a die, a wafer, or the like, and a dicing process. A dicing process may be performed, for example, using a sawing, lasing, or other process. In some embodiments, the dicing process separates the structure of FIG. 3H into separate packages.

As shown in FIG. 3H, the redistribution layers have been removed or omitted in the regions of the scribe lines. As such, in some embodiments the dicing operation is performed without dicing (e.g., sawing) through the redistribution layers. In some embodiments, the redistribution layers are recessed away from edges of the molding compound and along the corner regions of the molding compound. The corner regions of the redistribution layers may have a tapered, rounded or other recessed shapes.

Thereafter, the package illustrated in FIG. 3I may be mounted in a configuration such as that illustrated in FIG. 1. It is noted that FIG. 1 illustrates an embodiment in which a single die is included in the bottom package. In other embodiments, multiple dies may be utilized, such as the multi-die package of FIG. 3I, though some embodiments may include more than two dies.

The process described above represents a process in which the backside redistribution layers are formed first for illustrative purposes. In other embodiments, the backside redistribution layers may be formed after the front side redistribution layers are formed. For example, similar processes and materials may be utilized to form through vias on a carrier substrate without previously forming the backside redistribution layers, and attaching one or more dies to the carrier substrate. After forming the molding compound and the front side redistribution layers, the carrier substrate may be removed and another carrier substrate attached to the front side. The backside redistribution layers may then be formed over the backside of the die and molding compound.

Furthermore, first front side redistribution layers 330 are illustrated as being recessed only along the front side of the die for illustrative purposes. In other embodiments, the dielectric layers overlying the molding compound may be recessed over the backside, front side, or both the front side and the backside using similar processes and materials as those described above.

Figures 4A, 4B:
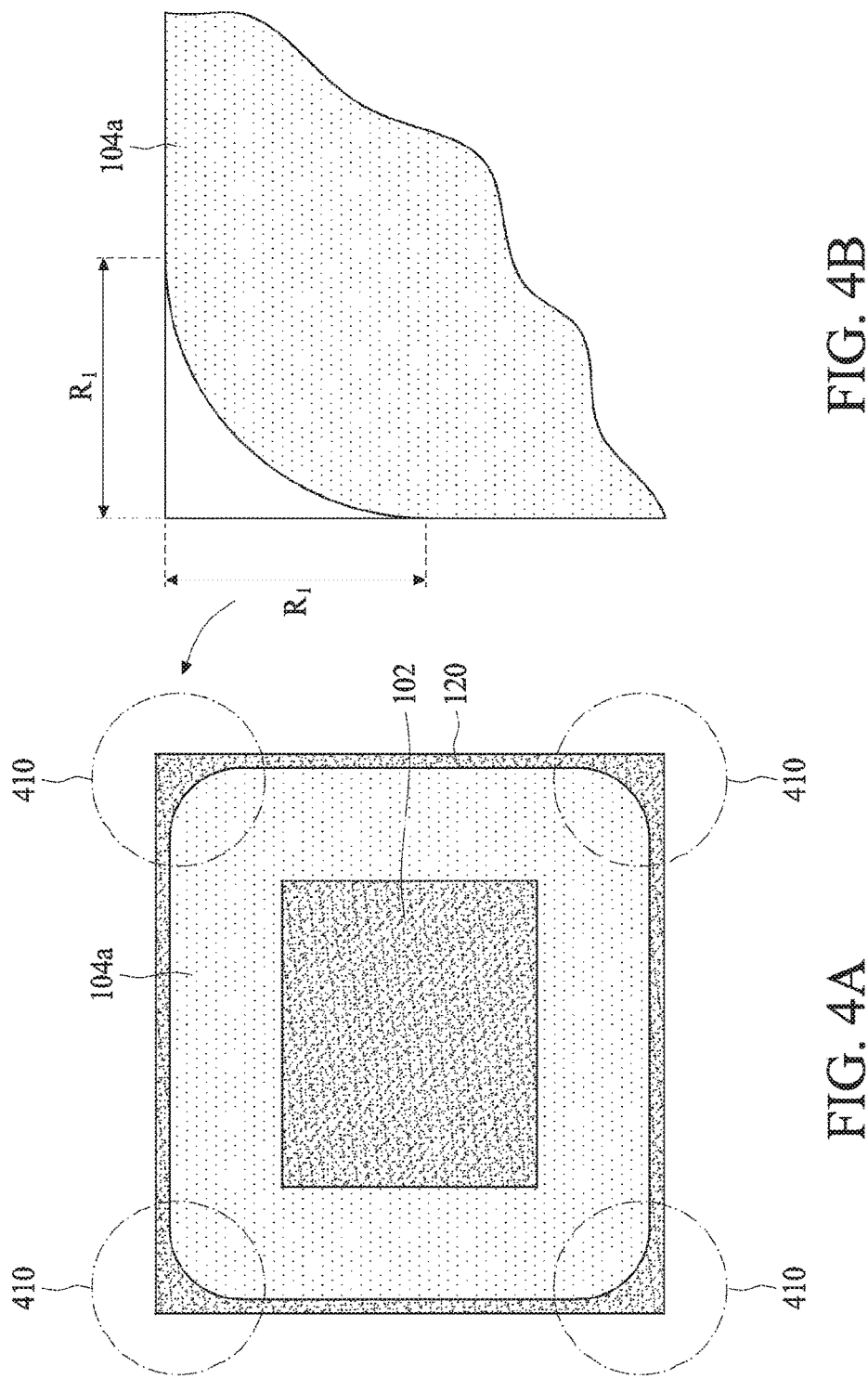
FIGS. 4A and 4B illustrate plan views of a package in accordance with some embodiments.

Referring now to FIGS. 4A and 4B, other shapes of corners may be used in accordance with other embodiments. FIGS. 1 and 2 illustrate embodiments in which the corner regions of the first backside redistribution layers 304 are tapered in a triangular shape for illustrative purposes. In other embodiments, other shapes may be used. For example, FIGS. 4A and 4B illustrate an embodiment in which the corner regions, identified by the corner regions 410, have a rounded recess, wherein FIG. 4B is an enlarged view of the corner regions 410 of FIG. 4A. In an embodiment, the rounded corners may have a radius of $R_1$, which in some embodiments may be from about 30 μm to about 100 μm, though other dimensions may be used. Dimensions such as these provide a sufficient recess to reduce or eliminate delamination, yet does not interfere with the routing of the metallization lines or placement of contact pads.

Figure 5:
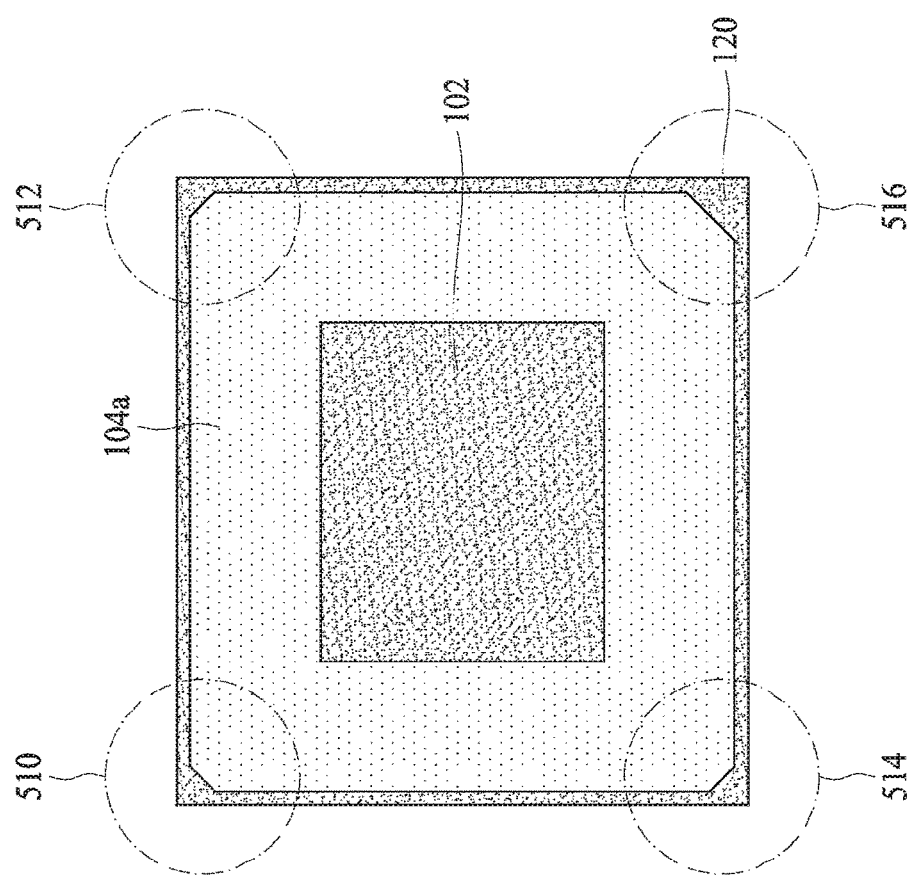
FIG. 5 illustrates a plan view of a package in accordance with some embodiments.

FIG. 5 illustrates an embodiment in which the dielectric layers 104a are recessed by different amounts in the different corners. For example, corner regions 510-514 of FIG. 5 are recessed a similar amount, and corner region 516 is recessed a greater amount. In an embodiment, the corner region 516 is recessed 20-100% larger than the corner regions 510-514. The corner region 516 with the larger recess area may be used, for example, to distinguish die orientation.

Figures 6A, 6B:
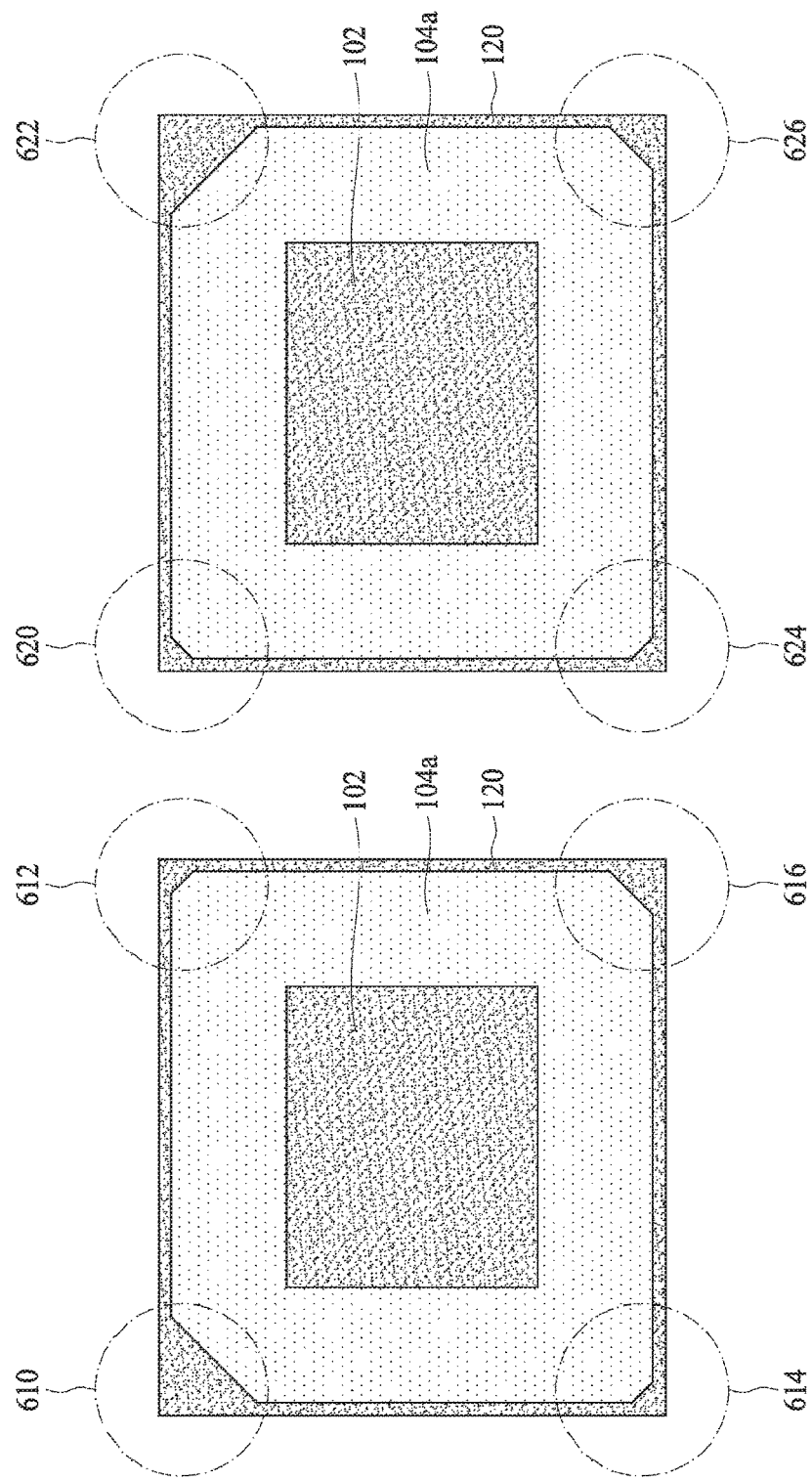
FIGS. 6A and 6B illustrate plan views of a package in accordance with some embodiments.

FIG. 5 illustrates an embodiment in which only one of the corner regions is larger than the others for illustrative purposes. Other embodiments may recess the dielectric layers 104a in two or more of the corner regions. For example, FIG. 6A illustrates an embodiment in which corner regions 610 and 616 are recessed a greater amount relative to corner regions 612 and 614. Additionally, the diagonal corner regions are illustrated as being similar for illustrative purposes, and in other embodiments, the relatively larger corner recesses may be adjacent corner regions, such as that illustrated in FIG. 6B wherein adjacent corner regions 622 and 626 are relatively larger than corner regions 620 and 624.

Figure 7:
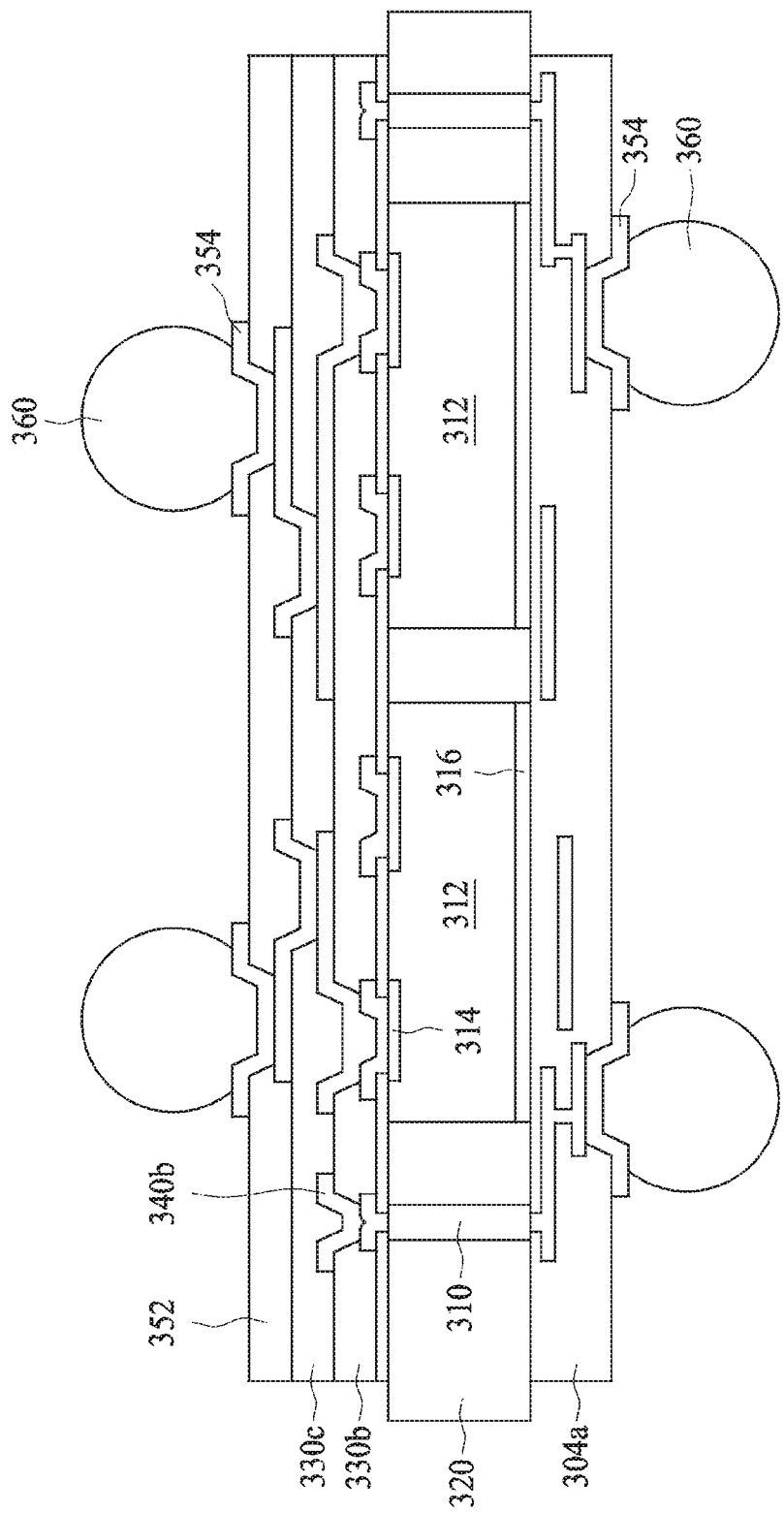
FIG. 7 illustrates a package in accordance with some embodiments.

FIG. 7 illustrates a package in which the backside redistribution layers 304 are also recessed in accordance with some embodiments. The embodiments discussed above illustrate an embodiment in which the front side redistribution layers 104 are recessed away from the scribe lines 308. In other embodiments, the backside redistribution layers 304 are recessed, and in some embodiments, both of the front side redistribution layers 104 and the backside redistribution layers 304 are recessed. FIG. 7 illustrates an embodiment in which both of the backside redistribution layers 304 and the front side redistribution layers 104 are recessed. Similar processes and materials may be used to recess the backside redistribution layers 304.

For example, in some embodiments, a process in which the backside redistribution layers are formed after the front side redistribution layers, and the backside redistribution layers are removed from the scribe line areas as described above. In such a process, the processes discussed above with reference to FIGS. 3B-3H are performed, and then the backside redistribution layers are formed in a similar process as the front side redistribution layers. Thereafter, a singulation process may be performed as discussed above.

Figure 8:
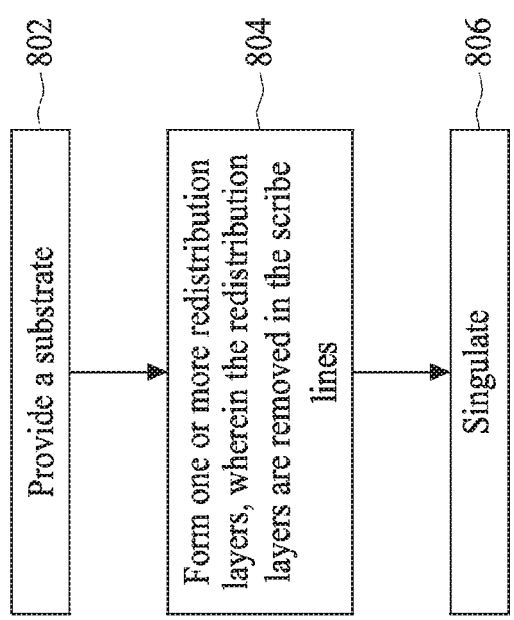
FIG. 8 is a flow diagram illustrating steps that may be performed to manufacture a device in accordance with some embodiments.

FIG. 8 is a flow chart illustrating a process of fabricating a semiconductor device in accordance with some embodiments. The process begins at step 802, wherein a substrate is provided. In some embodiments, the substrate comprises a carrier substrate with a die, molding compound along sidewalls of the die and through vias extending through the molding compound, such as that discussed above. Thereafter, in step 804, one or more redistribution layers are formed such that the redistribution layers are removed along the scribe lines. In some embodiments, corners of the redistribution layers are removed by, for example, rounding or tapering the corners of the redistribution layers. Next, in step 806, the structure may be singulated by, for example, sawing. By recessing the redistribution layers, delamination issues may be reduced or prevented during singulation.

In an embodiment, a device is provided. The device includes a die and molding compound adjacent sidewalls of the die. One or more first side dielectric layers is over a first side of the die and the molding compound, the one or more first side dielectric layers being recessed from an edge of the molding compound. The one or more first side dielectric layers have a non-perpendicular corner.

In another embodiment, a device is provided. The device includes a workpiece and one or more first redistribution layers extending over a first side of the workpiece. The first redistribution layers are recessed from a sidewall of the workpiece by a first distance along a sidewall region and recessed from the sidewall of the workpiece by a second distance along a corner region, wherein the second distance is greater than the first distance.

In yet another embodiment, a method is provided. The method providing a workpiece, wherein the workpiece has intersecting scribe lines. One or more first dielectric layers are formed over a first side of the workpiece. The first dielectric layers are recessed a first distance from the scribe lines at a first location near a first intersection of the scribe lines and recessed a second distance from the scribe lines at a second location, the second location being further from the first intersection than the first location. The first distance is greater than the second location. The workpiece is singulated along the scribe lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a workpiece, the workpiece having intersecting scribe lines;
forming one or more first dielectric layers over a first side of the workpiece, the first dielectric layers recessed a first distance from the scribe lines at a first location near a first intersection of the scribe lines, the first dielectric layers recessed a second distance from the scribe lines at a second location, the second location being further from the first intersection than the first location, the first distance being greater than the second distance, wherein the forming the first dielectric layers comprises recessing a first corner a greater distance than a second corner; and
singulating the workpiece along the scribe lines.

2. The method of claim 1, wherein the forming the first dielectric layers comprises forming rounded corners near intersecting scribe lines.

3. The method of claim 1, wherein the forming the first dielectric layers comprises forming tapered corners near intersecting scribe lines.

4. The method of claim 1, wherein the forming the first dielectric layers comprises forming a plurality of dielectric layers, the forming the plurality of dielectric layers comprising:
   forming a dielectric layer;
   patterning the dielectric layer to remove portions of the dielectric layer along scribe lines; and
   after the patterning, repeating the forming and the patterning one or more times.

5. A method comprising:
   placing a first die over a carrier substrate;
   forming a molding compound over the carrier substrate;
   forming one or more first redistribution layers over the molding compound and the first die, the one or more first redistribution layers comprising one or more first dielectric layers and one or more first conductive layers;
   removing the one or more first dielectric layers in a scribe line, the molding compound in the scribe line remaining after removing the one or more first dielectric layers; and
   singulating the first die along the scribe line, wherein an edge of the one or more first redistribution layers being recessed from an edge of the molding compound after singulating.

6. The method of claim 5, further comprising forming one or more second redistribution layers over the carrier substrate, wherein placing the first die over the carrier substrate comprises placing the first die over the one or more second redistribution layers, the one or more second redistribution layers being interposed between the first die and the carrier substrate.

7. The method of claim 6, wherein after singulating the first die along the scribe line, the edge of the one or more first redistribution layers being recessed from an edge of the of the one or more second redistribution layers in a plan view.

8. The method of claim 6, wherein after singulating the first die along the scribe line, an edge of the one or more second redistribution layers being recessed from an edge of the molding compound in a plan view.

9. The method of claim 5, wherein removing the one or more first dielectric layers comprises patterning the one or more first dielectric layers to have non-perpendicular corners in a plan view.

10. The method of claim 9, wherein the one or more first dielectric layers comprises rounded corners near intersecting scribe lines.

11. The method of claim 9, wherein the removing the one or more first dielectric layers comprises forming tapered corners near intersecting scribe lines.

12. The method of claim 9, wherein the removing the one or more first dielectric layers comprises recessing a first corner a greater distance than a second corner.

13. A method comprising:
   placing a first die and a second die over a carrier substrate;
   forming one or more conductive vias over the carrier substrate;
   forming a molding compound over the carrier substrate, the molding compound extending along sidewalls of the one or more conductive vias, the first die, and the second die;
   forming one or more first redistribution layers over a first side of the molding compound, first die and the second die, the one or more first redistribution layers comprising one or more first dielectric layers and one or more first conductive layers;
   removing at least a portion of the one or more first dielectric layers in a scribe line interposed between the first die and the second die to form a recess, the molding compound being exposed along a bottom of the recess; and
   singulating the first die from the second die along the scribe line, the one or more first redistribution layers being recessed by a first distance from a sidewall of the molding compound in a sidewall region, the one or more first redistribution layers being recessed from the sidewall of the molding compound by a second distance along a corner region, the second distance being greater than the first distance.

14. The method of claim 13, further comprising:
   forming one or more second redistribution layers extending over a second side of the molding compound, first die and the second die opposite the first side, the one or more second redistribution layers being recessed from the sidewall of the molding compound by a third distance along the sidewall region, the one or more second redistribution layers being recessed from the sidewall of the molding compound by a fourth distance along the corner region, the fourth distance being greater than the third distance.

15. The method of claim 13, wherein a corner of the one or more first redistribution layers is rounded.

16. The method of claim 13, wherein a corner of the one or more first redistribution layers is tapered.

17. The method of claim 13, wherein each corner of the one or more first redistribution layers is recessed a similar amount.

18. The method of claim 13, wherein at least one corner of the one or more first redistribution layers are recessed a different amount than another of the corners.

19. The method of claim 13, wherein first diagonal corners of the one or more first redistribution layers are recessed third distance, and wherein second diagonal corners of the one or more first redistribution layers are recessed a fourth distance, the third distance different than the fourth distance.

20. The method of claim 1, further comprising forming one of more conductive layers in the one or more first dielectric layers.

* * * * *